(12) United States Patent
Lee et al.

(10) Patent No.: US 12,123,914 B2
(45) Date of Patent: Oct. 22, 2024

(54) BATTERY MANAGEMENT APPARATUS AND METHOD

(71) Applicant: LG CHEM, LTD., Seoul (KR)

(72) Inventors: Kyu-Chul Lee, Daejeon (KR); Won-Tae Joe, Daejeon (KR)

(73) Assignee: LG ENERGY SOLUTION, LTD., Seoul (KR)

( * ) Notice: Subject to any disclaimer, the term of this patent is extended or adjusted under 35 U.S.C. 154(b) by 598 days.

(21) Appl. No.: 17/281,220

(22) PCT Filed: Mar. 31, 2020

(86) PCT No.: PCT/KR2020/004427
§ 371 (c)(1),
(2) Date: Jan. 21, 2022

(87) PCT Pub. No.: WO2020/204584
PCT Pub. Date: Oct. 8, 2020

(65) Prior Publication Data
US 2022/0221516 A1 Jul. 14, 2022

(30) Foreign Application Priority Data
Apr. 5, 2019 (KR) .................. 10-2019-0040455

(51) Int. Cl.
*G01R 31/367* (2019.01)
*G01R 31/36* (2020.01)
(Continued)

(52) U.S. Cl.
CPC ....... *G01R 31/367* (2019.01); *G01R 31/3648* (2013.01); *G01R 31/388* (2019.01);
(Continued)

(58) Field of Classification Search
CPC .. G01R 31/367; G01R 31/388; G01R 31/389; G01R 31/3648; H02J 7/007192; H02J 7/0048; H01M 10/48; H01M 10/4257
(Continued)

(56) References Cited

U.S. PATENT DOCUMENTS 6,160,382 A  12/2000  Yoon et al.
9,153,988 B2 10/2015  Iwane et al.
(Continued)

FOREIGN PATENT DOCUMENTS

CN  101512365 A  8/2009
CN  103969590 A  8/2014
(Continued)

OTHER PUBLICATIONS

Extended European Search Report dated Dec. 20, 2021 issued by the European Patent Office in corresponding European Patent Application No. 20785224.5.
(Continued)

*Primary Examiner* — Edward Tso
*Assistant Examiner* — Aaron Piggush
(74) *Attorney, Agent, or Firm* — Morgan, Lewis & Bockius LLP

(57) ABSTRACT

A battery management apparatus and method according to an embodiment of the present disclosure estimates an internal state of a battery cell by updating a battery model, and it is aimed to provide a battery management apparatus and method, which may construct a battery model optimized for a battery cell by obtaining a parameter of the battery model through a neural network and then repeatedly updating the parameter of the battery model based on a difference between an output value of the battery model that reflects the
(Continued)

obtained parameter and an actually measured value, and control charging of the battery based on the optimized battery model.

15 Claims, 7 Drawing Sheets

(51) Int. Cl.
    *G01R 31/388*     (2019.01)
    *G01R 31/389*     (2019.01)
    *H01M 10/48*     (2006.01)
    *H02J 7/00*     (2006.01)
    *H01M 10/42*     (2006.01)

(52) U.S. Cl.
    CPC .......... *G01R 31/389* (2019.01); *H01M 10/48* (2013.01); *H02J 7/0048* (2020.01); *H02J 7/007182* (2020.01); *H02J 7/007192* (2020.01); *H01M 10/4257* (2013.01)

(58) Field of Classification Search
    USPC .................. 320/134, 152, 153, 157, 162
    See application file for complete search history.

(56) References Cited

U.S. PATENT DOCUMENTS

| | | | | |
|---|---|---|---|---|
| 9,658,291 | B1* | 5/2017 | Wang | ................. G01R 31/3842 |
| 2001/0022509 | A1 | 9/2001 | Schulmayr et al. | |
| 2005/0194936 | A1 | 9/2005 | Cho | |
| 2008/0303528 | A1 | 12/2008 | Kim | |
| 2009/0276172 | A1 | 11/2009 | Nishi | |
| 2011/0161025 | A1 | 6/2011 | Tomura et al. | |
| 2013/0154577 | A1* | 6/2013 | Iwane | ................. G01R 31/367 320/162 |
| 2013/0268466 | A1 | 10/2013 | Baek et al. | |
| 2014/0217987 | A1 | 8/2014 | Shim et al. | |
| 2016/0003912 | A1 | 1/2016 | Iwane et al. | |
| 2017/0222447 | A1* | 8/2017 | Ravi | ..................... H02J 7/0048 |
| 2017/0288414 | A1* | 10/2017 | Klein | .................. G01R 31/367 |
| 2018/0045788 | A1 | 2/2018 | Kawai et al. | |
| 2018/0100898 | A1* | 4/2018 | Benosman | ........... G01R 31/367 |
| 2019/0250217 | A1 | 8/2019 | Cheng et al. | |

FOREIGN PATENT DOCUMENTS

| | | |
|---|---|---|
| CN | 109061506 A | 12/2018 |
| CN | 106033113 B | 3/2019 |
| EP | 1134868 B1 | 11/2007 |
| JP | 6145824 B2 | 6/2017 |
| JP | 2018-059910 A | 4/2018 |
| JP | 2018-169281 A | 11/2018 |
| KR | 10-0812760 B1 | 3/2008 |
| KR | 10-2013-0113296 A | 10/2013 |
| KR | 10-2014-0093552 A | 7/2014 |
| KR | 10-2017-0100066 A | 9/2017 |
| KR | 10-2018-0016493 A | 2/2018 |
| WO | 03/071617 A2 | 8/2003 |
| WO | 2013/184416 A2 | 12/2013 |

OTHER PUBLICATIONS

International Search Report (with partial translation) and Written Opinion issued in corresponding International Patent Application No. PCT/KR2020/004427, dated Jul. 22, 2020.

* cited by examiner

| TEMPERATURE (T) | STATE OF CHARGE(SOC) | FREQUENCY(F) | | | |
|---|---|---|---|---|---|
| $T_1$ | $S_1$ | $F_{11}$ | $F_{12}$ | $F_{13}$ | $F_{14}$ |
| $T_2$ | $S_2$ | $F_{21}$ | $F_{22}$ | $F_{23}$ | $F_{24}$ |
| $T_3$ | $S_3$ | $F_{31}$ | $F_{32}$ | $F_{33}$ | $F_{34}$ |
| $T_4$ | $S_4$ | $F_{41}$ | $F_{42}$ | $F_{43}$ | $F_{44}$ |
| ⋮ | | | | | |

| IDENTIFICATION NUMBER(ID) | TEMPERATURE (T) | STATE OF CHARGE(SOC) | IMPEDANCE(I) | | | |
|---|---|---|---|---|---|---|
| $ID_1$ | $T_1$ | $S_1$ | | | | |
| $ID_2$ | $T_2$ | $S_2$ | $I_{21}$ | $I_{22}$ | | |
| ⋮ | ⋮ | | | | | |

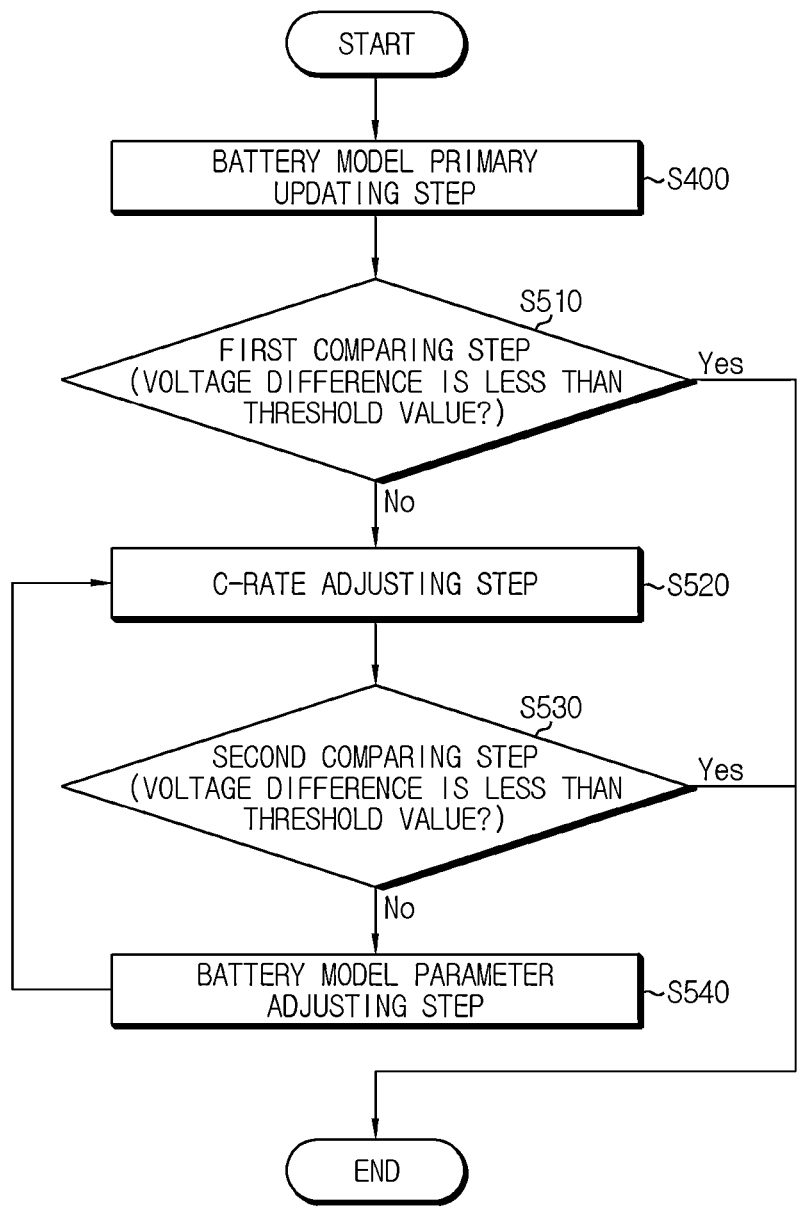

BATTERY MANAGEMENT APPARATUS AND METHOD

TECHNICAL FIELD

The present application claims priority to Korean Patent Application No. 10-2019-0040455 filed on Apr. 5, 2019 in the Republic of Korea, the disclosures of which are incorporated herein by reference.

The present disclosure relates to a battery management apparatus and method, and more particularly, to a battery management apparatus and method for estimating an internal state of a battery cell by updating a battery model.

BACKGROUND ART

Recently, the demand for portable electronic products such as notebook computers, video cameras and portable telephones has increased sharply, and electric vehicles, energy storage batteries, robots, satellites and the like have been developed in earnest. Accordingly, high-performance batteries allowing repeated charging and discharging are being actively studied.

Batteries commercially available at present include nickel-cadmium batteries, nickel hydrogen batteries, nickel-zinc batteries, lithium batteries and the like. Among them, the lithium batteries are in the limelight since they have almost no memory effect compared to nickel-based batteries and also have very low self-charging rate and high energy density.

Patent Document 1 discloses a system and method and a non-transitory computer-readable storage medium for estimating a battery state, which estimates a model, calculates a real-time measured battery-related signal as a cost function, and learning the cost function to update the estimated model parameter value.

However, Patent Document 1 only discloses theoretical model learning and updating. That is, Patent Document 1 does not disclose a configuration that trains a model through a result obtained by actually applying a trained and updated model and corrects an error between the theoretical estimation value and the actually measured value. Therefore, it is difficult to apply the model obtained from Patent Document 1 to an actual battery cell charging or discharging situation.
(Patent Document 1) JP 2018-059910 A

DISCLOSURE

Technical Problem

The present disclosure is designed to solve the problems of the related art, and therefore the present disclosure is directed to providing a battery management apparatus and method, which may construct a battery model optimized for a battery cell by obtaining a parameter of the battery model through a neural network and then repeatedly updating the parameter of the battery model based on a difference between an output value of the battery model that reflects the obtained parameter and an actually measured value, and control charging of the battery based on the optimized battery model.

These and other objects and advantages of the present disclosure may be understood from the following detailed description and will become more fully apparent from the exemplary embodiments of the present disclosure. Also, it will be easily understood that the objects and advantages of the present disclosure may be realized by the means shown in the appended claims and combinations thereof.

Technical Solution

A battery management apparatus according to one aspect of the present disclosure may comprise: a voltage measuring unit configured to measure a voltage and an open circuit voltage (OCV) of a battery cell; a temperature measuring unit configured to measure a temperature of the battery cell; and a control unit connected to the voltage measuring unit and the temperature measuring unit and configured to estimate a state of charge (SOC) of the battery cell according to the OCV measured by the voltage measuring unit, select a plurality of frequencies corresponding to the estimated SOC and the temperature measured by the temperature measuring unit, calculate an impedance of each frequency for the battery cell by applying a current having the plurality of selected frequencies to the battery cell, obtain an estimated parameter value of a predefined battery model by inputting the calculated impedance of each frequency to a pre-learned neural network, primarily update the battery model according to the obtained estimated parameter value, and secondarily update the battery model by repeatedly adjusting the parameter of the battery model until a voltage difference between the estimated voltage value calculated through the primarily updated battery model and the measured voltage value measured by the voltage measuring unit becomes less than a threshold value.

Preferably, the plurality of frequencies may include frequencies selected from a pre-stored frequency table that defines a plurality of frequencies corresponding to temperature and SOC of the battery cell.

The battery management apparatus according to the present disclosure may further comprise an electrical impedance spectroscopy (EIS) unit connected to the control unit and configured to change a frequency of a current supplied to the battery cell into the plurality of selected frequencies according to a request of the control unit. In an example, the current may be a sine wave current, a pulse charging/discharge current or a square wave current.

The control unit may be configured to calculate an impedance for the battery cell based on a plurality of voltages measured while the plurality of currents whose frequencies are changed by the EIS unit are being supplied to the battery cell.

The voltage measuring unit may be configured to measure the voltage of the battery cell when a current having a frequency at which the voltage of the battery cell is not measured in advance among the plurality of frequencies is supplied to the battery cell, at the estimated SOC and the measured temperature.

The estimated parameter value may be configured to include a value corresponding to the parameter of the predefined battery model.

The control unit may be configured to primarily update the battery model by changing a parameter corresponding to the obtained estimated parameter value among the parameters of the battery model into the obtained estimated parameter value.

The battery management apparatus according to the present disclosure may further comprise a charging unit connected to the control unit and configured to supply a current to the battery cell and charge the battery cell at a preset C-RATE according to the estimated SOC and the measured temperature when the battery model is primarily updated by the control unit.

The control unit may be configured to secondarily update the battery model by updating the parameter of the battery model based on a comparison result of the measured voltage value measured at the same point and the estimated voltage value obtained from the primarily updated battery model, when the battery cell is charged at the preset C-RATE by the charging unit.

Preferably, the control unit may be configured to change a C-RATE of a charge current by controlling the charging unit, when the voltage difference is greater than or equal to the threshold value.

The control unit may be configured to increase the C-RATE by controlling the charging unit, when the voltage difference is greater than or equal to the threshold value and the estimated voltage value is greater than or equal to the measured voltage value.

The control unit may be configured to decrease the C-RATE by controlling the charging unit, when the voltage difference is greater than or equal to the threshold value and the estimated voltage value is less than the measured voltage value.

The control unit may be configured to update the parameter of the battery model until a voltage difference between the measured voltage value of the battery cell measured by the voltage measuring unit and the estimated voltage value obtained using the secondarily updated battery model at the same point becomes less than the threshold value, after the C-RATE is changed.

The control unit may be configured to estimate state information for a negative electrode of the battery cell by using the secondarily updated battery model and adjust a magnitude of a charge current applied to the battery cell so that the estimated state information does not reach a threshold condition, while the battery cell is being charged.

The state information may be configured to include at least one of an estimated lithium ion ratio and a negative electrode potential for the negative electrode of the battery cell.

The control unit may be configured to adjust the magnitude of the charge current of the battery cell so that the estimated lithium ion ratio does not reach an upper threshold limit.

The control unit may be configured to adjust the magnitude of the charge current of the battery cell so that the negative electrode potential does not reach a lower threshold limit.

A battery pack according to another aspect of the present disclosure may comprise the battery management apparatus an embodiment of the present disclosure.

An electric vehicle according to still another aspect of the present disclosure may comprise the battery management apparatus an embodiment of the present disclosure.

A battery management method according to another aspect of the present disclosure may comprise: a frequency selecting step of selecting a plurality of frequencies corresponding to temperature and SOC of a battery cell; an impedance calculating step of calculating an impedance of each frequency of the battery cell by applying a current having the plurality of frequencies selected in the frequency selecting step to the battery cell; an estimated parameter value obtaining step of obtaining an estimated parameter value of a predefined battery model by inputting the impedance of each frequency calculated in the impedance calculating step to a pre-learned neural network; a battery model primary updating step of primarily updating the battery model according to the estimated parameter value obtained in the estimated parameter value obtaining step; and a battery model secondary updating step of secondarily updating the battery model by repeatedly adjusting the parameter of the battery model until a voltage difference between the estimated voltage value calculated through the primarily updated battery model in the battery model primary updating step and a measured voltage value for the battery cell becomes less than a threshold value.

Advantageous Effects

According to one aspect of the present disclosure, since the battery model is repeatedly updated so that the difference between a voltage value estimated from the battery model after the parameter of the battery model for estimating an internal state of the battery cell through a neural network is primarily updated and a measured voltage value is less than a threshold value, the internal state of the battery cell may be more accurately determined.

In addition, according to one aspect of the present disclosure, since the internal state of the battery cell, which cannot be measured, is more accurately estimated by using the estimated lithium ion ratio and/or the negative electrode potential of the negative electrode surface output from the battery model updated twice, C-RATE may be properly adjusted when rapidly charging the battery cell.

In addition, according to one aspect of the present disclosure, since the battery model is optimally constructed for each battery cell, even in a technical field using a plurality of battery cells, the internal state of each battery cell may be more accurately estimated.

The effects of the present disclosure are not limited to the effects mentioned above, and other effects not mentioned will be clearly understood by those skilled in the art from the description of the claims.

DESCRIPTION OF DRAWINGS

The accompanying drawings illustrate a preferred embodiment of the present disclosure and together with the foregoing disclosure, serve to provide further understanding of the technical features of the present disclosure, and thus, the present disclosure is not construed as being limited to the drawing.

FIG. 10 is a flowchart specifically showing another example of the battery model updating step in the battery management method according to an embodiment of the present disclosure.

BEST MODE

It should be understood that the terms used in the specification and the appended claims should not be construed as limited to general and dictionary meanings, but interpreted based on the meanings and concepts corresponding to technical aspects of the present disclosure on the basis of the principle that the inventor is allowed to define terms appropriately for the best explanation.

Therefore, the description proposed herein is just a preferable example for the purpose of illustrations only, not intended to limit the scope of the disclosure, so it should be understood that other equivalents and modifications could be made thereto without departing from the scope of the disclosure.

Additionally, in describing the present disclosure, when it is deemed that a detailed description of relevant known elements or functions renders the key subject matter of the present disclosure ambiguous, the detailed description is omitted herein.

The terms including the ordinal number such as "first", "second" and the like, may be used to distinguish one element from another among various elements, but not intended to limit the elements by the terms.

Throughout the specification, when a portion is referred to as "comprising" or "including" any element, it means that the portion may include other elements further, without excluding other elements, unless specifically stated otherwise. Furthermore, the term "control unit" described in the specification refers to a unit that processes at least one function or operation, and may be implemented by hardware, software, or a combination of hardware and software.

In addition, throughout the specification, when a portion is referred to as being "connected" to another portion, it is not limited to the case that they are "directly connected", but it also includes the case where they are "indirectly connected" with another element being interposed between them.

Hereinafter, preferred embodiments of the present disclosure will be described in detail with reference to the accompanying drawings.

Figure 1:
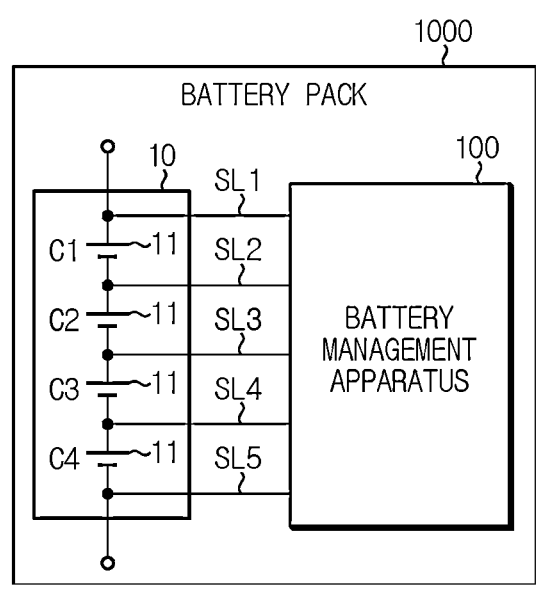
FIG. 1 is a diagram schematically showing a battery pack including a battery management apparatus according to an embodiment of the present disclosure.

FIG. 1 is a diagram schematically showing a battery pack including a battery management apparatus according to an embodiment of the present disclosure.

Referring to FIG. 1, a battery management apparatus 100 according to an embodiment of the present disclosure may be electrically connected to a battery module 10 including a plurality of battery cells 11 to manage the plurality of battery cells 11.

The battery management apparatus 100 may measure voltage, current and temperature of each battery cell 11 and estimate a state of charge (SOC). In addition, the battery management apparatus 100 may optimize a battery model for each battery cell 11 by updating the battery model for each battery cell 11. Also, the battery management apparatus 100 may adjust a rapid charge current based on the updated battery model, when the battery cell 11 is rapidly charged.

In addition, the battery management apparatus 100 may be included in a battery pack 1000 together with the battery module 10. FIG. 1 shows an example in which one battery module 10 and one battery management apparatus 100 are included in the battery pack 1000, but the number of the battery module 10 and the battery management apparatus 100 included in the battery pack 1000 is not limited to the number shown in FIG. 1. Similarly, the number of battery cells 11 included in the battery module 10 is not limited to the number shown in FIG. 1.

Figure 2:
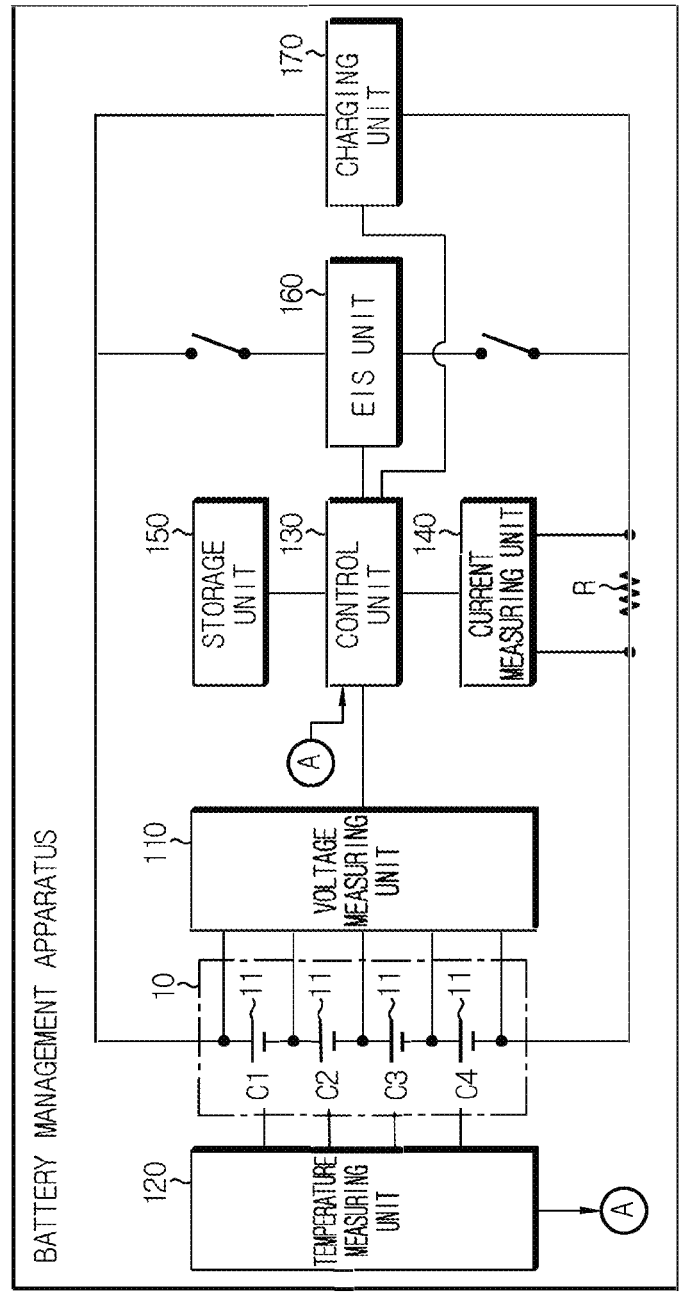
FIG. 2 is a block diagram schematically showing the battery management apparatus according to an embodiment of the present disclosure.

A detailed configuration of the battery management apparatus 100 will be described with reference to FIG. 2. FIG. 2 is a block diagram schematically showing the battery management apparatus according to an embodiment of the present disclosure. In FIG. 2, the battery module 10 is depicted with a dotted line inside the battery management apparatus 100 for convenience of description, and the battery module 10 should be not interpreted as being limitedly included inside the battery management apparatus 100 as in FIG. 2.

Referring to FIG. 2, the battery management apparatus 100 according to an embodiment of the present disclosure may include a voltage measuring unit 110, a temperature measuring unit 120 and a control unit 130.

The voltage measuring unit 110 may measure voltage and OCV of the battery cell 11. That is, the voltage measuring unit 110 may be configured to measure the voltage of each battery cell 11 included in the battery module while the battery cell 11 is being charged or discharged or in a no-load state.

For example, the voltage measuring unit 110 may measure the voltage while a first battery cell C1, a second battery cell C2, a third battery cell C3 and a fourth battery cell C4 included in the battery module are being charged or discharged or in a no-load state, respectively.

Specifically, in the embodiment of FIG. 1, the voltage measuring unit 110 may measure a voltage of the first battery cell C1 through a first sensing line SL1 and a second sensing line SL2 and measure a voltage of the second battery cell C2 through the second sensing line SL2 and a third sensing line SL3. In addition, the voltage measuring unit 110 may measure a voltage of the third battery cell C3 through the third sensing line SL3 and a fourth sensing line SL4 and measure a voltage of the fourth battery cell C4 through the fourth sensing line SL4 and a fifth sensing line SL5. In addition, the voltage measuring unit 110 may measure an open circuit voltage (OCV) of the battery cell 11. That is, the voltage measuring unit 110 may measure both the voltage and the OCV of the battery cell 11. For example, the voltage measuring unit 110 may measure the OCV of each of the first battery cell C1, the second battery cell C2, the third battery cell C3 and the fourth battery cell C4. Here, OCV is a voltage measured while the battery cells C1-C4 are in the no-load state. The voltage measuring unit 110 includes a common voltage measuring circuit.

The temperature measuring unit 120 may measure the temperature of the battery cell 11. That is, the temperature measuring unit 120 may include a temperature sensor capable of measuring the temperature of each battery cell 11. For example, as shown in FIG. 2, the temperature measuring unit 120 may be connected to each battery cell 11 to measure the temperature of each battery cell 11. In addition, the temperature measuring unit 120 may provide a measured temperature value for the temperature of the battery cell 11 to the control unit 130. The temperature measuring unit 120 includes a common temperature sensor such as a thermocouple.

The control unit 130 may be connected to the voltage measuring unit 110 and the temperature measuring unit 120. The control unit 130 may be electrically connected to the voltage measuring unit 110 and the temperature measuring unit 120 to receive a voltage value for the voltage and an OCV value for the OCV of the battery cell 11 measured by the voltage measuring unit 110 and receive a temperature value for the temperature of the battery cell 11 measured by the temperature measuring unit 120.

For example, in the embodiment of FIG. 2, the control unit 130 may be connected to the voltage measuring unit 110 and the temperature measuring unit 120 in a circuit. However, relative positions of the control unit 130, the voltage measuring unit 110 and the temperature measuring unit 120 shown in FIG. 2 are just examples, and the relative positions and connection relationship of the control unit 130, the voltage measuring unit 110 and the temperature measuring unit 120 according to the embodiment of FIG. 2 are not limited thereto.

According to one aspect, the control unit 130 may estimate SOC of the battery cell 11 according to the OCV measured by the voltage measuring unit 110. Here, SOC is a state of charge. In general, if battery cell 11 is in a sufficiently stabilized state, the OCV of the battery cell 11 has a one-to-one corresponding relationship with SOC. Conversely, if the battery cell 11 is charged or discharged, the SOC of the battery cell 11 may be estimated using a known current integration method or a Kalman filter.

In an embodiment, the control unit 130 may estimate the SOC of the battery cell 11 from the OCV measured by the voltage measuring unit 110 according to the corresponding relationship between the OCV and the SOC included in a pre-stored look-up table.

The control unit 130 may select a plurality of frequencies corresponding to the estimated SOC and the measured temperature. That is, the control unit 130 may select a plurality of frequencies corresponding to the estimated SOC of the battery cell 11 and the temperature of the battery cell 11 measured by the temperature measuring unit 120.

For example, it is assumed that the SOC of the battery cell 11 estimated by the control unit 130 is 10% and the temperature of the battery cell 11 measured by the temperature measuring unit 120 is 20° C. The control unit 130 may select frequencies $F_1, F_2, \ldots, F_n$ corresponding to SOC 10% and temperature 20° C. of the battery cell 11. Here, n is a positive integer. That is, the control unit 130 may select frequencies $F_1$ to $F_n$ based on the estimated SOC and the measured temperature of the battery cell 11. Hereinafter, for convenience of description, it will be described that the control unit 130 selects four frequencies. That is, the following description is based on the case where n is 4.

The control unit 130 may calculate impedance for each frequency of the battery cell 11 based on the estimated SOC, the measured temperature and the current having the plurality of selected frequencies. For example, currents having $F_1, F_2, F_3$ and $F_4$ frequencies selected in the former embodiment may be sequentially applied to each battery cell 11, and impedances for each frequency of the battery cell 11 may be calculated according to a known impedance calculation method such as EIS (Electrical Impedance Spectroscopy).

The control unit 130 may obtain an estimated parameter value of the battery model by inputting the calculated impedance for each frequency into a pre-learned neural network. For example, the control unit 130 may input the calculated impedance for each frequency in the pre-learned neural network. In addition, the control unit 130 may obtain a resistance-related value and a capacity-related value such as a scale of a negative electrode, a scale of a positive electrode and available lithium capacity from the pre-learned neural network, and obtain estimated parameter values corresponding to some of the parameters of the battery model by processing the obtained resistance-related value and the obtained capacity-related value. The estimated parameter value obtained as above will be described later using an equation.

Here, the neural network may be pre-learned according to a back-propagation learning algorithm to receive the impedance for each frequency as input data and output parameters of the predefined battery model as output data. As the learning algorithm, it is obvious that other known learning algorithms may be employed in addition to the back-propagation learning algorithm.

The control unit 130 may input the impedance for each frequency of each battery cell through the pre-learned neural network, and obtain estimated parameter values $P_1, P_2, P_3$, Pm corresponding to the parameters of the predefined battery model. Here, m is a positive integer. Hereinafter, for convenience of description, it is assumed that three estimated parameter values are obtained by the control unit 130. That is, the control unit 130 may obtain estimated parameter values $P_1, P_2$ and $P_3$ corresponding to the parameters of the battery model through the neural network.

The control unit 130 may primarily update the battery model according to the obtained estimated parameter value. For example, as in the former embodiment, the control unit 130 may obtain the estimated parameter values $P_1, P_2$ and $P_3$ from the neural network and primarily update the predefined battery model using the obtained estimated parameter values $P_1, P_2$ and $P_3$. That is, the control unit 130 may update the battery model by updating the corresponding parameter among the plurality of parameters of the battery model to the obtained estimated parameter values $P_1, P_2$ and $P_3$.

Here, the battery model may be defined for each battery cell 11. For example, in the embodiment of FIG. 2, the first battery model for the first battery cell C1, the second battery model for the second battery cell C2, the third battery model for the third battery cell C3 and the fourth battery model for the fourth battery cell C4 may be individually defined in advance.

For example, the battery model may employ a Newman's P2D model. The P2D model is a physic-based model developed using the theory of porous electrodes and concentrated solutions, and is a model that may accurately capture the movement of lithium ions in a battery. Therefore, the battery management apparatus according to an embodiment of the present disclosure may use the P2D model as the predefined battery model.

Some parameters to be updated among the parameters of the battery model will be described using Equations 1 to 4 below.

$$\frac{\partial}{\partial x}\left(k^{eff}\frac{\partial \varphi_e}{\partial x}\right) + \frac{\partial}{\partial x}\left(k_D^{eff}\frac{\partial \ln c_e}{\partial x}\right) + j^{Li} = 0 \quad \text{[Equation 1]}$$

Here, $k^{eff}$ is electrolyte ionic conductivity, $\varphi_e$ is an electrolyte phase potential, $k_D^{eff}$ is an electrolyte diffusional conductivity, $c_e$ is an electrolyte phase concentration, $j^{Li}$ is a function of overpotential, and the subscript e is an electrolyte phase.

For example, among the parameters of Equation 1, the parameter updated by the control unit 130 may be $k_{eff}$ and $k_D^{eff}$. That is, the estimated parameter value obtained by the control unit 130 may include values corresponding to the electrolyte ionic conductivity and the electrolyte diffusional conductivity. The control unit 130 may update the electrolyte ionic conductivity and the electrolyte diffusional conductivity by using the obtained estimated parameter value.

$$\frac{\partial}{\partial x}\left(\sigma^{eff}\frac{\partial \varphi_s}{\partial x}\right) - j^{Li} = 0 \quad \text{[Equation 2]}$$

Here, $\sigma^{eff}$ is effective electric conductivity, $\sigma_s$ is a solid (electrode) phase potential, and the subscript s is a solid (electrode) phase.

For example, among the parameters of Equation 2, the parameter updated by the eff control unit 130 may be $\sigma^{eff}$. That is, the estimated parameter value obtained by the control unit 130 may include a value corresponding to the effective electric conductivity. The control unit 130 may update the effective electric conductivity by using the obtained estimated parameter value.

$$\frac{\partial(\varepsilon_e c_e)}{\partial t} = \frac{\partial}{\partial x}\left(D_e^{eff}\frac{\partial c_e}{\partial x}\right) + \frac{1-t_+^0}{F}j^{Li} \quad \text{[Equation 3]}$$

Here, $\varepsilon_e$ is a volume fraction of electrolyte phase in electrode, $D_e^{eff}$ is an electrolyte ionic diffusivity, and $t_+^0$ is a transference number of lithium ion.

For example, among the parameters of Equation 3, the parameter updated by the control unit 130 may be $D_e^{eff}$. That is, the estimated parameter value obtained by the control unit 130 may include a value corresponding to the electrolyte ionic diffusivity. The control unit 130 may update the electrolyte ionic diffusivity to the obtained estimated parameter value.

$$\frac{\partial c_s}{\partial t} = \frac{D_s}{r^2}\frac{\partial}{\partial r}\left(r^2\frac{\partial c_s}{\partial r}\right) \quad \text{[Equation 4]}$$

Here, $D_s$ may be a diffusion coefficient of Li in solid (electrode), r is a dimension, and $c_s$ is a solid (electrode) phase concentration.

For example, among the parameters of Equation 4, the parameter updated by the control unit 130 may be $D_s$. That is, the estimated parameter value obtained by the control unit 130 may include a value corresponding to the diffusion coefficient of Li in solid (electrode). The control unit 130 may update the diffusion coefficient of Li in solid (electrode) to the obtained estimated parameter value.

In summary, the estimated parameter values obtained by the control unit 130 may include values corresponding to the electrolyte ionic conductivity, the electrolyte diffusional conductivity, the effective electric conductivity, the electrolyte ionic diffusivity and the diffusion coefficient of Li at the electrode of the battery model. The control unit 130 may primarily update the battery model by updating the corresponding parameter among the parameters of the battery model to the obtained estimated parameter value.

Meanwhile, even if the first battery cell C1 to the fourth battery cell C4 are produced through the same process, shipped on the same day and included in the same battery module, the states of the battery cells 11 may not be entirely identical to each other due to various causes such as initial resistance variation and capacity variation. Therefore, the control unit 130 may primarily update only the first battery model using the estimated parameter value for the first battery cell C1 and may not primarily update the second to fourth battery models using the estimated parameter value for the first battery cell C1.

The control unit 130 may be configured to secondarily update the battery model by repeatedly adjusting the parameters of the battery model so that a voltage difference between the measured voltage value measured by the voltage measuring unit 110 and the estimated voltage value calculated by using the primarily updated battery model while the battery cell 11 is being charged becomes less than a threshold value.

Specifically, the control unit 130 may obtain the estimated voltage value for the battery cell 11 by processing the value output from the primarily updated battery model while the battery cell 11 is being charged. In addition, the control unit 130 may secondarily update the battery model according to the voltage difference between the obtained estimated voltage value and the measured voltage value measured by the voltage measuring unit 110, which is an actually measured value for the voltage of the battery cell 11.

For example, seeing Equation 2, the control unit 130 may obtain $\varphi_s^+$ and $\varphi_s^-$ from the battery model. That is, the control unit 130 may obtain a positive electrode phase potential and a negative electrode phase potential from the battery model. In addition, the control unit 130 may obtain an estimated voltage value using a potential difference between $\varphi_s^+$ and $\varphi_s^-$ obtained as above.

The control unit 130 may calculate the voltage difference by an equation "|estimated voltage value−measured voltage value|". That is, the control unit 130 may secondarily update the battery model according to the magnitude of an absolute value of the difference between the estimated voltage value and the measured voltage value. Like the former embodiment, the control unit 130 may secondarily update the first battery model based on the voltage difference between the estimated voltage value and the measured voltage value for the first battery cell C1, and the control unit 130 may not train the second to fourth battery models based on the voltage difference between the estimated voltage value and the measured voltage value for the first battery cell C1.

Specifically, the control unit 130 may secondarily update the battery model by re-adjusting the parameter value of the battery model updated using the estimated parameter value. For example, based on the voltage difference between the estimated voltage value and the measured voltage value, the control unit 130 secondarily update the battery model values corresponding to the electrolyte ionic conductivity, the electrolyte diffusional conductivity, the effective electric conductivity, the electrolyte ionic diffusivity and the diffusion coefficient of Li in the electrode of the battery model updated using the estimated parameter values. In this case, in order to finely tune the parameters of the battery model, the control unit 130 may select an approximate value close to the present model parameter by using an algorithm such as Random search, Gaussian process or Greedy search, and secondarily update the parameter of the battery model using the selected approximate value.

The battery management apparatus 100 according to an embodiment of the present disclosure may primarily update the predefined battery model based on the estimated parameter value obtained using the neural network, and secondarily update the battery model based on the difference between the estimated voltage value and the measured voltage value. Therefore, the battery management apparatus 100 has an advantage of reliably obtaining internal state information for the battery cell 11 by using the repeatedly updated battery model.

Here, the control unit 130 may selectively include processors known in the art, application-specific integrated circuit (ASIC), other chipsets, logic circuits, registers, communication modems, data processing devices, and the like to execute various control logic performed in the battery management apparatus 100 according to an embodiment of the present disclosure. Also, when the control logic is implemented in software, the control unit 130 may be implemented as a set of program modules. At this time, the program module may be stored in a memory and executed by a processor. The memory may be located inside or out of the processor and may be connected to the processor by various well-known means. For example, the control unit 130 may be a processor included in the battery management apparatus 100 according to an embodiment of the present disclosure, which calculates the impedance of the battery cell 11 and updates the battery model by adjusting the parameters of the battery model. In addition, the control unit 130 may be connected to the voltage measuring unit 110 and the temperature measuring unit 120 to send and receive signals.

Also, referring to FIG. 2, the battery management apparatus 100 according to an embodiment of the present disclosure may further include a current measuring unit 140. The current measuring unit 140 may be configured to measure a charge current input to the battery cell 11 or a discharge current output from the battery cell 11. For example, in the embodiment of FIG. 2, the current measuring unit 140 may be connected to both ends of a sense resistor R to measure the charge current or the discharge current. The control unit 130 may determine whether the battery cell 11 is in a stabilized state by using the current measured by the current measuring unit 140 before the voltage measuring unit 110 measures the OCV of the battery cell 11. For example, if a state where the charge current or the discharge current of the battery cell 11 measured by the current measuring unit 140 is maintained as 0 [A] for a preset time, the control unit 130 may determine that the battery cell 11 is in a stabilized state and then measure the OCV of the battery cell 11 by using the voltage measuring unit 110. In addition, the voltage measuring unit 110 may measure the OCV of the battery cell 11 after a measurement signal is transmitted from the control unit 130.

In addition, referring to FIG. 2, the battery management apparatus 100 according to an embodiment of the present disclosure may further include a storage unit 150. The storage unit 150 may store programs and data necessary for executing the neural network used to update the battery model, functions related to the battery model, parameter values of the battery model, and the like. That is, the storage unit 150 may store data necessary for operation and function of each component of the battery management apparatus 100 according to an embodiment of the present disclosure, such as the neural network and the battery model, data generated in the process of performing the operation or function, or the like. The storage unit 150 is not particularly limited in its kind as long as it is a known information storage means that can record, erase, update and read data. As an example, the information storage means may include RAM, flash memory, ROM, EEPROM, registers, and the like. The storage unit 150 may store program codes in which processes executable by the control unit 130 are defined.

Preferably, the plurality of frequencies may include a frequency selected from a pre-stored frequency table including a plurality of frequencies predetermined according to the temperature and SOC of the battery cell 11. Here, the pre-stored frequency table is pre-stored in the storage unit 150, and may be a look-up table from which a plurality of frequencies may be refer to according to the temperature and SOC of the battery cell 11.

Figures 3, 4, 5:
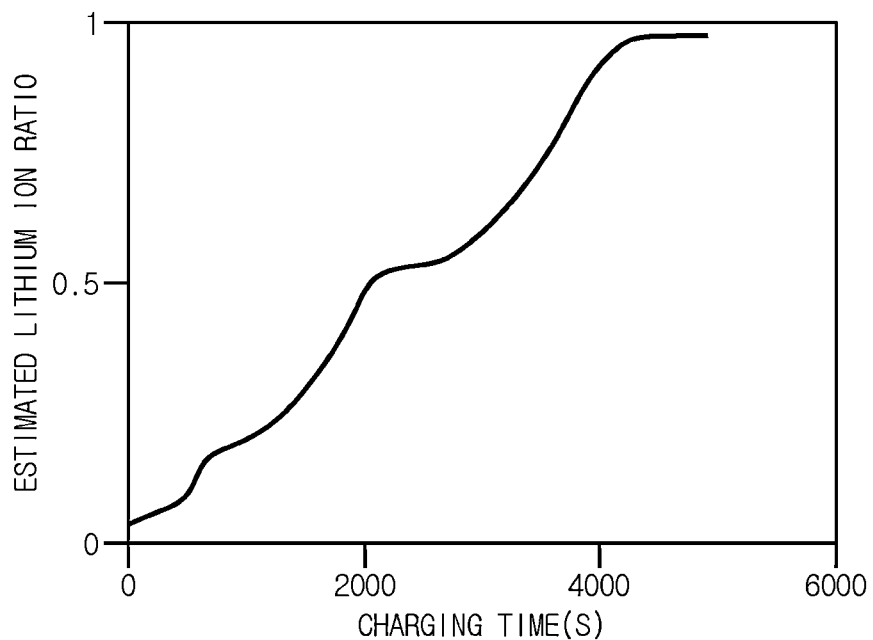
FIG. 3 is a diagram showing an example of a frequency table stored in advance in the battery management apparatus according to an embodiment of the present disclosure.
FIG. 4 is a diagram showing an example of an impedance table stored in the battery management apparatus according to an embodiment of the present disclosure.
FIG. 5 is a diagram showing an example of an estimated lithium ion ratio of a negative electrode, obtained from a battery model, at the battery management apparatus according to an embodiment of the present disclosure.

FIG. 3 is a diagram showing an example of a frequency table stored in advance in the battery management apparatus according to an embodiment of the present disclosure. Referring to FIG. 3, the pre-stored frequency table may include temperature (T), SOC and frequency (F) fields. For example, frequencies $F_{11}$, $F_{12}$, $F_{13}$ and $F_{14}$ corresponding to temperature $T_1°$ C. and SOC $S_1\%$ may be included in a first record. In addition, frequencies $F_{21}$, $F_{22}$, $F_{23}$ and $F_{24}$ corresponding to temperature $T_2°$ C. and SOC $S_2\%$ may be included in a second record.

For example, in the pre-stored frequency table, the temperature field and the SOC field may be set as composite keys. Accordingly, the control unit 130 may select a plurality of frequencies corresponding to the temperature of the battery cell 11 measured by the temperature measuring unit 120 and the calculated SOC of the battery cell 11 using the pre-stored frequency table. Therefore, a plurality of records having different SOCs for the same temperature may exist in the pre-stored frequency table. For example, as in the third and fourth records, there may be records having different SOCs $S_3\%$ and $S_4\%$ for temperature $T_3°$ C. However, setting the temperature field and the SOC field as composite keys is only an example of the pre-stored frequency table, and the pre-stored frequency table is not limited thereto.

That is, the battery management apparatus 100 according to an embodiment of the present disclosure may select a plurality of frequencies at which the internal state of the battery cell 11 may be measured more accurately, by using the frequency table in which temperature, SOC and a plurality of frequencies are stored in pairs. Therefore, the current having a plurality of selected frequencies is supplied to the battery cell 11 by the battery management apparatus 100 based on the temperature and SOC of the battery cell 11, rather than a current having a randomly selected frequency, so that the internal state of the battery cell 11 may be determined more accurately.

Also, referring to FIG. 2, the battery management apparatus 100 according to an embodiment of the present disclosure may further include an EIS (Electrical Impedance Spectroscopy) unit connected to the control unit 130 and configured to change the frequency of the current supplied to the battery cell 11 to the plurality of selected frequencies by the control unit 130. That is, the EIS unit 160 may be electrically connected to the control unit 130 to transmit and receive signals to/from each other, and may apply a current in the form of sine wave or pulse to the battery cell 11.

For example, as in the former embodiment, it is assumed that the control unit 130 selects frequencies $F_1$, $F_2$, $F_3$ and $F_4$ by using the pre-stored frequency table. The control unit 130 may send a $F_1$ frequency application signal to the EIS unit 160. The EIS unit 160 receiving the $F_1$ frequency application signal from the control unit 130 outputs a current having the $F_1$ frequency, and as a result, the current having the $F_1$ frequency may be supplied to the battery cell 11. In an example, the current supplied to the battery cell 11 is a pulse current. Similarly, the control unit 130 may send a $F_2$ frequency application signal, a $F_3$ frequency application signal and a $F_4$ frequency application signal to the EIS unit 160, respectively. At this time, the control unit 130 may send different frequency application signals to the EIS unit 160 at a regular time interval. For example, the control unit 130 may send different frequency application signals to the EIS unit 160 at an interval of 10 ms.

In addition, the control unit 130 may be configured to calculate the impedance for the battery cell 11 based on a plurality of voltages measured while the plurality of currents whose frequency is changed by the EIS unit 160 are being supplied to the battery cell 11. The control unit 130 may be configured to calculate the impedance of each battery cell 11 based on the plurality of voltages measured by the voltage measuring unit 110. That is, the control unit 130 may transmit a frequency application signal to the EIS unit 160, and the EIS unit 160 may apply a current having a specific frequency to the battery cell 11 based on the received frequency application signal. The voltage measuring unit 110 may measure the voltage of each battery cell 11 immediately after the current having the frequency output from the EIS unit 160 is supplied to each battery cell 11. Here, the control unit 130 may transmit a plurality of frequency application signals to the EIS unit 160, and the EIS unit 160 may output currents having different frequencies at a time interval based on the plurality of received frequency application signals. Therefore, the voltage measuring unit 110 may measure the voltage of each battery cell 11 whenever currents having a different frequency are supplied to each battery cell 11. In addition, the control unit 130 may receive a plurality of voltages measured by the voltage measuring unit 110 and calculate the impedance of each battery cell 11 based on the plurality of received voltages. The method of measuring the impedance of each frequency of the battery cell 11 by using the response characteristics of the battery cell 11 after applying the plurality of currents with different frequencies to the battery cell 11 is widely known under the name of EIS (Electrical Impedance Spectroscopy) and thus will not be described in detail.

In the embodiment of FIG. 3, as in the former embodiment, it is assumed that the control unit 130 selects frequencies $F_1$, $F_2$, $F_3$ and $F_4$ through the pre-stored frequency table. The control unit 130 may transmit the $F_1$ frequency application signal to the EIS unit 160, the EIS unit 160 may apply the current having the $F_1$ frequency to the battery cell 11, and the voltage measuring unit 110 may measure a first voltage of the battery cell 11 to which the current having the $F_1$ frequency is supplied. Similarly, the voltage measuring unit 110 may measure a second voltage of the battery cell 11 to which the current having the $F_2$ frequency is supplied, a third voltage of the battery cell 11 to which the current having the $F_3$ frequency is supplied, and a fourth voltage of the battery cell 11 to which the current having the $F_4$ frequency is supplied. The control unit 130 may receive the first to fourth voltages from the voltage measuring unit 110, and calculate the impedance of the battery cell 11 by using the first to fourth voltages and an AC current applied to the battery cell 11. Meanwhile, the voltage may be measured several times for each frequency, and thus each of the first to fourth voltages may include single voltage data or plurality of voltage data.

The battery management apparatus 100 according to an embodiment of the present disclosure may more accurately determine the impedance of the battery cell 11 by supplying a current having each of the plurality of frequencies selected based on the temperature and SOC of the battery cell 11 to the battery cell 11.

The voltage measuring unit 110 may be configured to measure the voltage when a current having a frequency at which the voltage of the battery cell 11 is not measured in advance among the plurality of frequencies is supplied to the battery cell 11, at the estimated SOC and the measured temperature.

That is, the control unit 130 may transmit the frequency application signal for some of the plurality of frequencies selected from the pre-stored frequency table to the EIS unit 160. Here, some frequencies are unused frequencies that are not used to determine the impedance of the battery cell 11. In addition, the voltage measuring unit 110 may measure the voltage of the battery cell 11 when a current having an unused frequency is supplied to the battery cell 11. This will be described with reference to FIG. 4.

FIG. 4 is a diagram showing an example of an impedance table stored in the battery management apparatus according to an embodiment of the present disclosure. Referring to FIG. 4, the impedance table may include an identification number (ID), temperature (T), state of charge (SOC) and impedance (I) of the battery cell 11 as fields. The impedance table may be stored in the storage unit 150.

The impedance (I) field may include a value for the impedance of each frequency calculated by the control unit 130. In addition, the number of impedances (I) is identical to the number of the plurality of frequencies determined in advance according to the temperature and SOC of the battery cell 11 in the pre-stored frequency table.

For example, in the first record 401 of FIG. 4, the impedance (I) fields are all empty. That is, referring to FIG. 3, this is because the impedances are not calculated for the frequencies $F_{11}$, $F_{12}$, $F_{13}$ and $F_{14}$ corresponding to the temperature $T_1°$ C. and SOC $S_1\%$ included in the first record 401. In this case, as in the former embodiment, the control unit 130 may transmit the frequency application signal for each of the frequencies $F_{11}$, $F_{12}$, $F_{13}$ and $F_{14}$ to the EIS unit 160 while the temperature and SOC of the battery cell 11 are $T_1°$ C. and $S_1\%$, respectively. In addition, the EIS unit 160 may output each of the currents having the frequencies $F_{11}$, $F_{12}$, $F_{13}$ and $F_{14}$, and the voltage measuring unit 110 may measure the voltage of the battery cell 11 when different currents having the frequencies $F_{11}$, $F_{12}$, $F_{13}$ and $F_{14}$ are applied to the battery cell 11.

In the second record 402 of FIG. 4, the impedance (I) fields are just partially recorded. That is, referring to FIG. 3, in the case of the second record 402 of FIG. 4, the frequency application signals for the frequencies $F_{21}$ and $F_{22}$ among the frequencies $F_{21}$, $F_{22}$, $F_{23}$ and $F_{24}$ corresponding to the temperature $T_2°$ C. and SOC $S_2\%$ are transmitted to the EIS unit 160 in the past, and the $I_{21}$ and $I_{22}$ impedances are calculated in advance based on the voltage measured when the currents having the $F_{21}$ and $F_{22}$ frequencies are applied to the battery cell 11. In this case, while the impedances 121, 122, 123 and 124 for the frequencies $F_{21}$, $F_{22}$, $F_{23}$ and $F_{24}$ are being calculated, the impedance calculating process is terminated before the impedances 123 and 124 are calculated due to any reason. In this case, the control unit 130 may record the already calculated impedance in the impedance table. In addition, during the impedance calculating process, the control unit 130 may not calculate the already calculated impedance repeatedly with reference to the impedance table. That is, in the second record of FIG. 4, the control unit 130 may omit calculation of $I_{21}$ and $I_{22}$ and just calculate only $I_{23}$ and $I_{24}$. Thus, the control unit 130 may transmit only the frequency application signals for $F_{23}$ and $F_{24}$ to the EIS unit 160. In addition, the EIS unit 160 may output the currents having the frequencies $F_{23}$ and $F_{24}$, respectively, and the voltage measuring unit 110 may measure the voltage of the battery cell 11 when each of the currents having the frequencies $F_{23}$ and $F_{24}$ is applied to the battery cell 11.

The battery management apparatus 100 according to an embodiment of the present disclosure may prevent the impedance from being repeatedly calculated under the same conditions by storing the frequency table and the impedance table and recording the already measured values. Therefore, the time required to update the battery model is shortened, so that the battery model may be rapidly updated even in the rapid charging situation of the battery cell 11.

Preferably, the estimated parameter value is a value obtained using the neural network and may include a value corresponding to the parameter of the predefined battery model. That is, the control unit 130 may obtain the estimated parameter value by processing the values output from the neural network, and the obtained estimated parameter value may correspond to some of the parameters of the predefined battery model.

Accordingly, the control unit 130 may be configured to primarily update the battery model by changing the parameter corresponding to the obtained estimated parameter value among the parameters of the battery model to the obtained estimated parameter value.

In the present disclosure, since the battery model is updated based on the temperature, SOC and impedance of the battery cell 11 through the pre-learned neural network, the battery management apparatus 100 has the advantage of more accurately determining the internal state of each battery cell 11 by using the battery model optimized for each battery cell 11.

Referring to FIG. 2, the battery management apparatus 100 according to an embodiment of the present disclosure may further include a charging unit 170 connected to the control unit 130 and configured to supply a current to the battery cell 11. That is, the charging unit 170 for supplying a current to the battery cell 11 may be included inside the battery management apparatus 100 or may be provided out of the battery management apparatus 100.

Both the charging unit 170 included inside the battery management apparatus 100 and the charging unit 170 provided out of the battery management apparatus 100 may be electrically connected to the control unit 130 and supply a current to the battery cell 11.

In one embodiment, the charging unit 170 provided out of the battery management apparatus 100 may be connected to the control unit 130 using a connector. The connector includes a communication line, so that the charging unit 170 may communicate with the control unit 130.

The charging unit 170 may be configured to charge the battery cell 11 at a preset C-RATE according to the estimated SOC and the measured temperature if the battery model is primarily updated by the control unit 130. That is, if the battery model is primarily updated by the control unit 130, the charging unit 170 may charge the battery cell 11 at the preset C-RATE according to the estimated SOC and the measured temperature of the battery cell 11 according to the request of the control unit 130. If the battery model is primarily updated completely, the charging unit 170 may receive a battery charging signal including the reset C-RATE from the control unit 130. At this time, the charging unit 170 may charge the battery cell 11 at the preset C-RATE. The preset C-RATE is stored in the storage unit 150, and the control unit 130 may transmit the preset C-RATE to the charging unit 170 together with the battery charging signal.

When the battery cell 11 is charged at the preset C-RATE, the control unit 130 may be configured to secondarily update the battery model by updating the parameter of the battery model based on the voltage difference between the measured voltage value measured and the estimated voltage value obtained from the primarily updated battery model at the same time point. That is, the voltage measuring unit 110 may measure the voltage of the battery cell 11 at a first time point when the battery cell is charged at the preset C-RATE, and transmit the measured voltage value to the control unit 130. The control unit 130 may obtain the estimated voltage value using the battery model updated at the first time point and compare the obtained estimated voltage value with the received measured voltage value. In addition, the control unit 130 may secondarily update the battery model based on the comparison result.

As in the previous example, the control unit 130 may secondarily update the battery model based on the voltage difference between the estimated voltage value and the measured voltage value. Here, the voltage difference may be calculated using an equation "|estimated voltage value−measured voltage value|".

In one embodiment, it is assumed that the charging unit 170 is charging the battery cell 11 at 4C C-RATE, the measured voltage value is measured as 4.05 [V] and the estimated voltage value is obtained as 4.1 [V] based on the same time point. The control unit 130 may secondarily update the battery model based on the magnitude of an absolute value of the voltage difference between the estimated voltage value and the measured voltage value. That is, the control unit 130 may secondarily update the battery model to correct the 0.05 [V] error. Specifically, the control unit 130 may update the primarily updated parameter using the estimated parameter value among the parameters included in the battery model in order to correct the 0.05 [V] error.

According to the present disclosure, the battery management apparatus 100 according to an embodiment of the present disclosure may secondarily update the battery model based on the voltage difference between the measured voltage value and the estimated voltage value while charging the battery cell 11 at the preset C-RATE. By updating the battery model multiple times as described above, the battery management apparatus 100 has an advantage of improving reliability of the output value of the battery model and accurately determining the internal state of the battery cell 11.

The control unit 130 may be configured to change the C-RATE of the charge current by controlling the charging unit, if the voltage difference is greater than or equal to a threshold value.

Here, the threshold value is a threshold value for the absolute value of the voltage difference between the estimated voltage value and the measured voltage value, and may be a value pre-stored in the storage unit 150.

If the voltage difference between the estimated voltage value and the measured voltage value is greater than or equal to the threshold value, the control unit 130 may determine this as an abnormal SOC and transmit a signal to the charging unit 170 to change the C-RATE. That is, the control unit 130 commands the charging unit 170 to change the C-RATE, thereby adjusting the magnitude of the current supplied to the battery cell 11.

Conversely, if the voltage difference between the estimated voltage value and the measured voltage value is less than the threshold value, the control unit 130 may determine that the estimated voltage value is within a normal range and not update the updated battery model any more.

The battery management apparatus 100 according to an embodiment of the present disclosure may reduce the time required to optimize the battery model by terminating the secondary update of the battery model if the voltage difference between the estimated voltage value and the measured voltage value is less than the set threshold value, even though the estimated voltage value estimated by the control unit 130 and the measured voltage value measured by the voltage measuring unit 110 are not completely the same. In addition, if the voltage difference between the estimated voltage value and the measured voltage value is greater than or equal to the threshold value, the battery management apparatus 100 may correct the voltage difference by adjusting the magnitude of the current supplied to the battery cell 11.

Preferably, the control unit may be configured to increase the C-RATE by controlling the charging unit, if the voltage difference is greater than or equal to the threshold value and the estimated voltage value is greater than or equal to the measured voltage value.

For example, it is assumed that the estimated voltage value is 4.1 [V], the measured voltage value is 4.05 [V], and the threshold value is set to 0.05 [V] based on the same time point as in the previous example. The control unit 130 may calculate 0.05 [V] as the absolute value of the voltage difference between the measured voltage value and the estimated voltage value. In this case, since the threshold value and the calculated voltage difference are the same and the estimated voltage value is greater than or equal to the measured voltage value, the control unit 130 may transmit a C-RATE increase signal to the charging unit 170 to increase the C-RATE. That is, even though the battery cell 11 is charged at the preset C-RATE, since the measured voltage value does not reach the estimated voltage value, the control unit 130 may determine that the charging limit value of the battery cell 11 is not yet reached and transmit the C-RATE increase signal to the charging unit 170.

Conversely, if the voltage difference is greater than or equal to the threshold value and the estimated voltage value is less than the measured voltage value, the control unit may be configured to reduce the C-RATE by controlling the charging unit.

For example, it is assumed that the estimated voltage value is 4 [V], the measured voltage value is 4.1 [V], and the threshold value is set to 0.05 [V]. The control unit 130 may calculate 0.1 [V] as the absolute value of the voltage difference between the measured voltage value and the estimated voltage value. In this case, since the calculated voltage difference exceeds the threshold value and the estimated voltage value is less than the measured voltage value, the control unit 130 may transmit a C-RATE decrease signal to the charging unit 170 to decrease the C-RATE. That is, if the battery cell 11 is charged at the preset C-RATE, since the measured voltage value exceeds the estimated voltage value, the control unit 130 may determine that the preset C-RATE approaches to or exceeds the charging limit value of the battery cell 11 and decrease the C-RATE by controlling the charging unit 170.

The battery management apparatus 100 according to an embodiment of the present disclosure may increase or decrease the C-RATE in consideration of all of the voltage difference, the threshold value, the estimated voltage value and the measured voltage value. Therefore, the battery management apparatus 100 may prevent overcharging or overdischarging of the battery cell 11 in advance in the process of optimizing the parameters of the battery model by adjusting the current applied to the battery cell 11.

The control unit 130 may be configured to adjust the parameters of the battery model until the voltage difference between the measured voltage value of the battery cell 11 measured by the voltage measuring unit 110 and the estimated voltage value obtained using the learned battery model at the same time becomes less than the threshold value, after the C-RATE is changed. The control unit 130 may secondarily update the battery model by adjusting the parameters of the battery model until the voltage difference becomes less than the threshold value. Specifically, among the parameters of the battery model, the parameter updated to the estimated parameter value in the primarily updating process may be secondarily updated.

In one embodiment, the control unit 130 may compare a first voltage difference between the estimated voltage value obtained using the primarily updated battery model at a first time point and the measured voltage value of the battery cell 11 measured at the first time point with the threshold value. If the first voltage difference is greater than or equal to the threshold value, the control unit 130 may adjust the magnitude of the charge current. In addition, the control unit 130 may compare a second voltage difference between the estimated voltage value obtained using the primarily updated battery model at a second time point and the measured voltage value of the battery cell 11 measured at the second time point with the threshold value. If the second voltage difference is greater than or equal to the threshold value, the control unit 130 may secondarily update the battery model by changing the parameters of the primarily updated battery model. Preferably, the control unit 130 may repeatedly adjust the parameters of the battery model until the condition that the voltage difference between the estimated voltage value and the measured voltage value is less than the threshold value is satisfied.

According to the present disclosure, since the battery management apparatus 100 according to an embodiment of the present disclosure updates the battery model until the voltage difference between the estimated voltage value and the measured voltage value becomes less than the threshold value, it is possible to further improve the reliability of the estimated voltage value that is an output of the battery model.

While the battery cell is being charged, the control unit 130 may estimate state information about the negative electrode of the battery cell by using the secondarily updated battery model. For example, the state information about the negative electrode of the battery cell 11 may include at least one of an estimated lithium ion ratio and a negative electrode potential about the negative electrode of the battery cell 11.

That is, the secondarily updated battery model may be configured to determine not only the estimated voltage value of the battery cell 11 but also at least one of a surface lithium ion concentration and a negative electrode potential of the negative electrode of the battery cell 11. Here, the surface lithium ion concentration is $c_s$ of Equation 4, and the negative electrode potential is $\varphi_s$ of Equation 2.

The control unit 130 may be configured to adjust the magnitude of the charge current applied to the battery cell so that the estimated state information about the negative electrode of the battery cell does not reach a threshold condition. For example, the control unit 130 may be configured to adjust the magnitude of the charge current of the battery cell 11 so that the estimated lithium ion ratio does not reach an upper threshold limit. In addition, the control unit 130 may be configured to adjust the magnitude of the charge current of the battery cell 11 so that the negative electrode potential does not reach a lower threshold limit. That is, the control unit 130 may adjust the magnitude of the charge current of the battery cell 11 based on the obtained estimated lithium ion ratio or the obtained negative electrode potential.

Here, the estimated lithium ion ratio and the negative electrode potential about the negative electrode of the battery cell 11 are factors that are essentially considered when the battery cell 11 is rapidly charged. If the estimated lithium ion ratio becomes equal to or greater than the threshold value or the negative electrode potential has a negative potential, the control unit 130 may determine that lithium (Li) plating occurs in the battery cell 11. That is, the control unit 130 may determine that lithium ions are combined with each other and precipitated as lithium in the negative electrode of the battery cell 11. Lithium is a metal that reacts violently with water, and when lithium is precipitated by the combination of lithium ions inside the battery cell 11, swelling may occurs to cause inflation of the battery cell 11 due to moisture penetrated into the battery cell 11, and the battery cell 11 may explode. Therefore, the control unit 130 may obtain at least one of the estimated lithium ion ratio and the negative electrode potential for the negative electrode of the battery cell 11 from the secondarily updated battery model, and determine the C-RATE corresponding to the internal state of the battery cell 11, while the battery cell 11 is being charged. In addition, the control unit 130 may change the C-RATE of the charge current currently applied to the battery cell into the determined C-RATE by controlling the charging unit 170.

Figure 6:
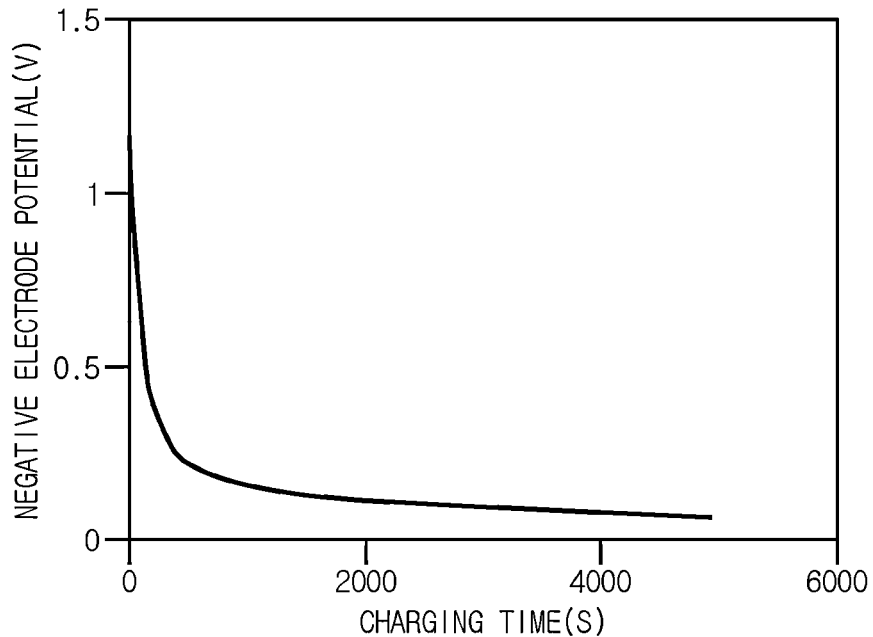
FIG. 6 is a diagram showing an example of a negative electrode potential, obtained from the battery model, at the battery management apparatus according to an embodiment of the present disclosure.

FIG. 5 is a diagram showing an example of an estimated lithium ion ratio of a negative electrode, obtained from a battery model, at the battery management apparatus according to an embodiment of the present disclosure. FIG. 6 is a diagram showing an example of a negative electrode potential, obtained from the battery model, at the battery management apparatus according to an embodiment of the present disclosure.

Referring to FIG. 5, the control unit 130 may determine the estimated lithium ion ratio for the negative electrode of the battery cell 11 from the secondarily updated battery model. Here, the estimated lithium ion ratio is a value estimated by the secondarily updated battery model and may be calculated using an equation "estimated lithium ion concentration÷lithium ion concentration threshold value". That is, the estimated lithium ion ratio may be a ratio of the estimated lithium ion concentration to the lithium ion concentration threshold value. Here, the estimated lithium ion concentration is $c_s$ of Equation 4, and the lithium ion concentration threshold value is a threshold value at which lithium plating occurs at the negative electrode, which is set in advance through experiments.

In the embodiment of FIG. 5, the estimated lithium ion ratio of the battery cell 11 is getting closer to 1 as the charging time increases. Therefore, since the estimated lithium ion concentration of the battery cell 11 is reaching the lithium ion concentration threshold value by charging, if the estimated lithium ion concentration increases to a preset value near the lithium ion concentration threshold value, the control unit 130 may transmit a C-RATE decrease signal to the charging unit 170 so that the charging C-RATE of the battery cell 11 is reduced.

In addition, referring to FIG. 6, the control unit 130 may determine the negative electrode potential for the battery cell 11 from the secondarily updated battery model. Here, the negative electrode potential is a value estimated by the secondarily updated battery model, which is $\varphi_s$ of Equation 2. In the embodiment of FIG. 6, the negative electrode potential of the battery cell 11 approaches 0 [V] as the charging time increases. Therefore, if the negative electrode potential falls to a preset value near 0 [V], the control unit 130 may transmit a C-RATE decrease signal to the charging unit 170 so that the charging C-RATE of the battery cell 11 is reduced. That is, the control unit 130 may reduce the C-RATE of the charge current applied to the battery cell 11 by controlling the charging unit 170.

The battery management apparatus 100 according to an embodiment of the present disclosure may more accurately measure the internal state of the battery cell 11 and determine a charge current optimized for the battery cell 11 by estimating the estimated lithium ion ratio and the negative electrode potential, which are substantially impossible to directly measure on the battery cell 11, using the secondarily updated battery model. Accordingly, the battery management apparatus 100 has an advantage of rapidly and safely perform rapid charging for the battery cell 11 by properly adjusting the charging C-RATE when the battery cell 11 is rapidly charged.

Figure 7:
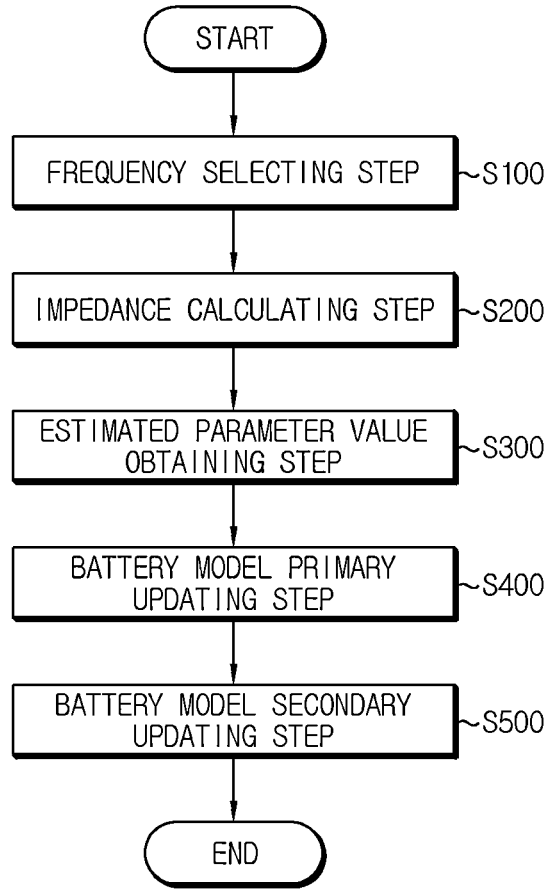
FIG. 7 is a flowchart schematically showing a battery management method according to an embodiment of the present disclosure.

FIG. 7 is a flowchart schematically showing a battery management method according to an embodiment of the present disclosure. The battery management method may be executed by the battery management apparatus 100 according to an embodiment of the present disclosure.

Referring to FIG. 7, the battery management method according to an embodiment of the present disclosure may include a frequency selecting step (S100), an impedance calculating step (S200), an estimated parameter value obtaining step (S300), a battery model primary updating step (S400) and a battery model secondary updating step (S500).

The frequency selecting step (S100) is a step of selecting a plurality of frequencies corresponding to the temperature and SOC of the battery cell 11, and may be performed by the control unit 130.

The control unit 130 may select a plurality of frequencies corresponding to the present temperature and SOC of the battery cell 11 using the frequency table pre-stored in the storage unit 150. The method of calculating the present temperature and SOC is described above.

The impedance calculating step (S200) is a step of calculating the impedance for each frequency of the battery cell 11 by applying a current having the plurality of frequencies selected in the frequency selecting step (S100) to the battery cell 11, and may be performed by the control unit 130 and the EIS unit 160.

First, the control unit 130 may transmit the plurality of frequencies selected in the frequency selecting step (S100) to the EIS unit 160. In addition, the EIS unit 160 may apply different currents corresponding to the plurality of received frequencies to the battery cell 11 at regular time intervals.

In addition, the control unit 130 may also transmit the plurality of frequencies selected in the frequency selecting step one by one to the EIS unit 160 at regular time intervals. In this case, if the EIS unit 160 receives the frequency from the control unit 130, the EIS unit 160 may immediately apply the current having the received frequency to the battery cell 11.

The voltage measuring unit 110 may measure the voltage of the battery cell 11 at least once whenever a plurality of currents having different frequencies are supplied to the battery cell 11. In addition, the voltage measuring unit 110 may transmit a voltage value for the measured voltage to the control unit 130. The control unit 130 may calculate the impedance of the battery cell 11 based on the voltage value received from the voltage measuring unit 110.

The estimated parameter value obtaining step (S300) is a step of obtaining the estimated parameter value of the predefined battery model by inputting the impedance for each frequency calculated in the impedance calculating step (S200) into the pre-learned neural network, and may be performed by the control unit 130.

Specifically, the estimated parameter value obtaining step (S300) is a step of obtaining an estimated value of a parameter of the predefined battery model based on the temperature, SOC and impedance of the battery cell 11 by using the pre-learned neural network.

That is, the control unit 130 may input the temperature of the battery cell 11 received from the temperature measuring unit 120, the SOC estimated based on the OCV of the battery cell 11 received from the voltage measuring unit 110 and the impedance calculated in the impedance calculating step (S200) through the pre-learned neural network. In addition, the control unit 130 may obtain a value related to the output resistance and capacity from the neural network, and process the obtained value related to the resistance and capacity to obtain an estimated parameter value.

The battery model primary updating step (S400) is a step of primarily updating the battery model using the obtained estimated parameter value, and may be performed by the control unit 130.

The control unit 130 may change some of the parameters of the battery model into the estimated parameter values obtained in the estimated parameter value obtaining step (S300). That is, since the estimated parameter value obtained using the neural network corresponds to some of the parameters of the battery model, the control unit 130 may primarily update the battery model by changing some of the parameters of the battery model into the obtained estimated parameter value.

The battery model secondary updating step (S500) is a step of secondarily update the battery model by repeatedly adjusting the parameters of the battery model until the voltage difference between the estimated voltage value calculated through the primarily updated battery model in the battery model primary updating step (S400) and the measured voltage value for the battery cell 11 becomes less than the threshold, and may be performed by the control unit 130.

Specifically, the battery model secondary updating step (S500) is a step of secondarily update the battery model by adjusting the parameters of the battery model once again based on the voltage difference between the estimated voltage value calculated using the primarily updated battery model and the measured voltage value, which is an actual voltage of the battery cell 11, while charging the battery cell 11 at a preset C-RATE.

The control unit 130 may obtain a positive electrode phase potential and a negative electrode phase potential from the battery model obtained in the battery model primary updating step (S400), and obtain the estimated voltage value for the battery cell 11 through the difference between the obtained positive electrode phase potential and the obtained negative electrode phase potential. In addition, the voltage measuring unit 110 may measure the voltage of the battery cell 11, and transmit the measured voltage value to the control unit 130. The control unit 130 may adjust the parameters of the battery model if the voltage difference between the estimated voltage value and the measured voltage value is greater than or equal to the threshold value.

In addition, the control unit 130 may obtain the estimated voltage value using the battery model whenever the parameters of the battery model are adjusted, and repeat the secondary updating step (S500) of the battery model until the voltage difference between the obtained estimated voltage value and the measured voltage value becomes less than the threshold value. Preferably, the estimation time point of the estimated voltage value and the measurement time point of the measured voltage value are the same.

Figure 8:
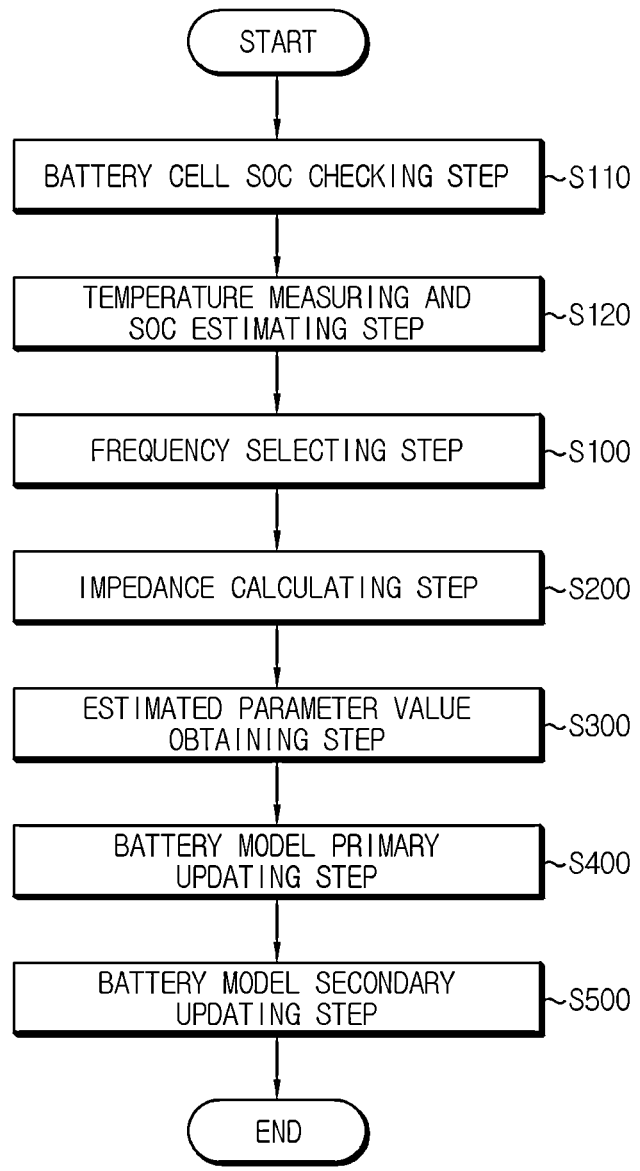
FIG. 8 is a flowchart schematically showing a battery management method according to another embodiment of the present disclosure.

FIG. 8 is a flowchart schematically showing a battery management method according to another embodiment of the present disclosure. The battery management method shown in FIG. 8 may further include a state checking state (S110) and a temperature measuring and SOC estimating step (S120) of the battery cell 11, compared to the battery management method shown in FIG. 7. That is, in the battery management method shown in FIGS. 7 and 8, the frequency selecting step (S100), the impedance calculating step (S200), the estimated parameter value obtaining step (S300), the battery model primary updating step (S400) and the battery model secondary updating step (S500) are the same as each other.

The battery management method shown in FIG. 8 may also be executed by the battery management apparatus according to an embodiment of the present disclosure.

The state checking state (S110) of the battery cell 11 is a step of checking whether the battery cell 11 is in a stabilized state at which OCV can be measured.

The current measuring unit 140 may measure a current of the battery cell 11 and transmit the current value for the measured current to the control unit 130. The control unit 130 may receive the current value from the current measuring unit 140, and may determine that the battery cell 11 is in a stabilized state if the received current value is 0 [A] or within a normal range from 0 [A] and a no-load state or a low-current state of the battery cell 11 continues over a preset time.

The temperature measuring and SOC estimating step (S120) is a step of measuring the temperature and estimating the SOC of the battery cell 11 in a stabilized state.

If it is determined that the battery cell 11 is in a stabilized state in the state checking state (S110) of the battery cell 11, the temperature measuring unit 120 may measure the temperature of the battery cell 11, and the voltage measuring unit 110 may measure the OCV of the battery cell 11.

The control unit 130 may receive the temperature value of the battery cell 11 from the temperature measuring unit 120 and the OCV value of the battery cell 11 from the voltage measuring unit 110. The control unit 130 may estimate the SOC of the battery cell 11 corresponding to the OCV value by referring to an OCV-SOC look-up table based on the received OCV value.

After that, as described above with reference to FIG. 7, the frequency selecting step (S100) may be performed.

Figure 9:
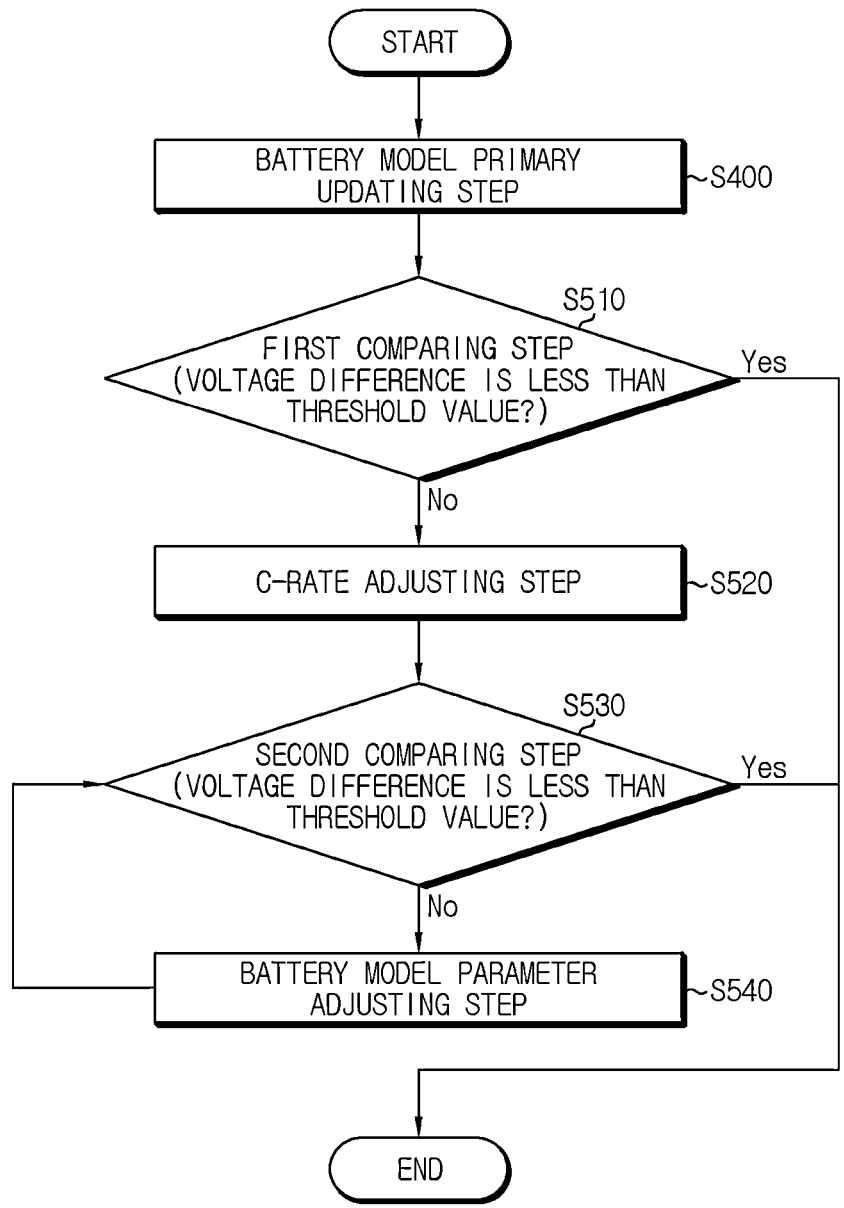
FIG. 9 is a flowchart specifically showing an example of a battery model updating step in the battery management method according to an embodiment of the present disclosure.

FIG. 9 is a flowchart specifically showing an example of a battery model secondary updating step in the battery management method according to an embodiment of the present disclosure.

Referring to FIG. 9, after the primary updating step (S400) of the battery model, the secondary updating step of the battery model may include a first comparing step (S510), a C-RATE adjusting step (S520), a second comparing step (S530) and a battery model parameter adjusting step (S540).

The first comparing step (S510) is a step of comparing the estimated voltage value obtained using the battery model updated in the battery model primary updating step (S400) and the measured voltage value, which is an actually measured voltage value of the battery cell 11, while charging the battery cell 11 at the preset C-RATE. Here, the estimation time point of the estimated voltage value and the measurement time point of the measured voltage value are the same.

The control unit 130 may determine whether the voltage difference between the estimated voltage value and the measured voltage value is less than the preset threshold value.

The C-RATE adjusting step (S520) is performed when the voltage difference is greater than or equal to the preset threshold value and is a step of adjusting the charging C-RATE of the battery cell 11 based on the voltage difference.

If the voltage difference between the estimated voltage value and the measured voltage value is greater than or equal to the preset threshold value and the estimated voltage value is greater than or equal to the measured voltage value, the control unit 130 may transmit a C-RATE increase signal to the charging unit 170.

Conversely, if the voltage difference between the estimated voltage value and the measured voltage value is greater than or equal to the preset threshold value and the estimated voltage value is less than the measured voltage value, the control unit 130 may transmit a C-RATE decrease signal to the charging unit 170.

The charging unit 170 may adjust the charging C-RATE according to the C-RATE increase signal or the C-RATE decrease signal received from the control unit 130. That is, the control unit 130 may adjust the C-RATE of the charge current applied to the battery cell 11 by controlling the charging unit 170.

The second comparing step (S530) is a step of comparing the voltage difference between the measured voltage value of the battery cell 11 measured after the C-RATE is adjusted and the estimated voltage value obtained using the updated battery model. Here, the estimation time point of the estimated voltage value and the measurement time point of the measured voltage value are the same.

After the C-RATE adjusting step (S520), the voltage measuring unit 110 may measure a second measured voltage value for the voltage of the battery cell 11, and transmit the measured second measured voltage value to the control unit 130. That is, in the first comparing step (S510), the voltage difference between the first measured voltage value of the battery cell 11 before the C-RATE is adjusted and the first estimated voltage value output from the battery model is compared, but in the second comparing step (S530), the voltage difference between the second measured voltage value of the battery cell 11 after the C-RATE is adjusted and the first estimated voltage value may be compared.

The battery model parameter adjusting step (S540) is a step of secondarily updating the battery model by adjusting the parameters of the battery model based on the comparison result of the second comparing step (S530).

If the voltage difference between the estimated voltage value and the measured voltage value is greater than or equal to the preset threshold value, the control unit 130 may secondarily update the battery model by adjusting the parameters of the battery model.

Optionally, after the second comparing step (S530), unlike the first comparing step (S510), even though the voltage difference is greater than or equal to the preset threshold value, the C-RATE may not be adjusted.

After the battery model parameter adjusting step (S540) is completed, the second comparing step (S530) may be performed again. In this case, in the second comparing step (S530), the voltage difference between the second measured voltage value of the battery cell 11 and the second estimated voltage value obtained using the battery model having the adjusted parameter may be compared. The second comparing step (S530) and the battery model parameter adjusting step (S540) may be repeatedly performed until the voltage difference between the estimated voltage value and the measured voltage value becomes less than the threshold value.

FIG. 10 is a flowchart specifically showing another example of the battery model secondary updating step in the battery management method according to an embodiment of the present disclosure.

The main difference between the battery model secondary updating step shown in FIG. 10 and the battery model secondary updating step shown in FIG. 9 is whether the C-RATE adjusting step (S520) is performed after the second comparing step (S530) and the battery model parameter adjusting step (S540).

In the battery management method shown in FIG. 9, the C-RATE adjusting step (S520) is performed after the first comparing step (S510), and then the C-RATE is not adjusted. However, in the battery management method shown in FIG. 10, after the first comparing step (S510) and the C-RATE adjusting step (S520) are performed, the C-RATE adjusting step (S520) may be performed after the second comparing step (S530) and the battery model parameter adjusting step (S540).

That is, referring to FIG. 10, if the voltage difference between the estimated voltage value and the measured voltage value is greater than or equal to the threshold value in the second comparing step (S530), the C-RATE may be adjusted after the battery model parameter is adjusted in the battery model parameter adjusting step (S540).

In one embodiment, as in the previous example, the voltage difference between the first estimated voltage value and the second measured voltage value may be compared in the second comparing step (S530). In addition, if the voltage difference is greater than or equal to the threshold value, the parameters of the battery model may be adjusted and the C-RATE may be adjusted. After that, in the second comparing step (S530), the voltage difference between the second estimated voltage value obtained using the battery model having the adjusted parameter and a third measured voltage value, which is the voltage of the battery cell 11 charged at the adjusted C-RATE, may be compared.

According to the battery management method shown in FIG. 10, since both the parameter and C-RATE of the battery model are adjusted during the repeated processing, the battery model may be updated more adaptively to the battery cell 11.

The battery pack 1000 according to the present disclosure may include the battery management apparatus 100 according to the present disclosure described above. In addition, the battery pack 1000 according to the present disclosure may further include a battery cell 11, various electrical components (including a BMS, a relay, a fuse, or the like) and a pack case, in addition to the battery management apparatus 100.

In addition, as another embodiment of the present disclosure, the battery management apparatus 100 may be mounted to various devices using electric energy, such as an electric vehicle, an energy storage system (ESS), and the like.

In particular, the battery management apparatus 100 according to the present disclosure may be included in an electric vehicle. That is, the electric vehicle according to the present disclosure may include the battery management apparatus 100 according to the present disclosure. Here, the battery management apparatus 100 may be included in the battery pack 1000 or may be implemented as a device separate from the battery pack 1000.

For example, at least a part of the battery management apparatus 100 may be implemented by an electronic control unit (ECU) of a vehicle. In addition, the vehicle according to the present disclosure may include a vehicle body or electronic equipment, which is typically provided in the vehicle, in addition to the battery management apparatus 100. For example, the vehicle according to the present disclosure may include a contactor, an inverter, a motor, at least one ECU, and the like, in addition to the battery management apparatus 100 according to the present disclosure. However, the present disclosure is not particularly limited in terms of components of the vehicle other than the battery management apparatus 100.

The embodiments of the present disclosure described above may not be implemented only through an apparatus and a method, but may be implemented through a program that realizes a function corresponding to the configuration of the embodiments of the present disclosure or a recording medium on which the program is recorded. The program or recording medium may be easily implemented by those skilled in the art from the above description of the embodiments.

The present disclosure has been described in detail. However, it should be understood that the detailed description and specific examples, while indicating preferred embodiments of the disclosure, are given by way of illustration only, since various changes and modifications within the scope of the disclosure will become apparent to those skilled in the art from this detailed description.

Additionally, many substitutions, modifications and changes may be made to the present disclosure described hereinabove by those skilled in the art without departing from the technical aspects of the present disclosure, and the present disclosure is not limited to the above-described embodiments and the accompanying drawings, and each embodiment may be selectively combined in part or in whole to allow various modifications.

REFERENCE SIGNS

10: battery module
11: battery cell
100: battery management apparatus
110: voltage measuring unit
120: temperature measuring unit
130: control unit
140: current measuring unit
150: storage unit
160: EIS unit
170: charging unit
1000: battery pack

What is claimed is:

1. A battery management apparatus, comprising:
   a voltage measuring unit configured to measure a voltage and an open circuit voltage (OCV) of a battery cell;
   a temperature measuring unit configured to measure a temperature of the battery cell; and
   a control unit connected to the voltage measuring unit and the temperature measuring unit, the control unit being configured to:
      estimate a state of charge (SOC) of the battery cell according to the OCV measured by the voltage measuring unit;
      select a plurality of frequencies corresponding to the estimated SOC and the temperature measured by the temperature measuring unit;
      calculate an impedance of each frequency for the battery cell by applying a current having the plurality of selected frequencies to the battery cell;
      obtain an estimated parameter value of a predefined battery model by inputting the calculated impedance of each frequency to a pre-learned neural network;
      primarily update the battery model according to the obtained estimated parameter value; and
      secondarily update the battery model by repeatedly adjusting the parameter of the battery model until a voltage difference between the estimated voltage value calculated through the primarily updated battery model and the measured voltage value measured by the voltage measuring unit becomes less than a threshold value.

2. The battery management apparatus according to claim 1, wherein the plurality of frequencies include frequencies selected from a pre-stored frequency table that defines a plurality of frequencies corresponding to the temperature and the SOC of the battery cell.

3. The battery management apparatus according to claim 1, further comprising:
   an electrical impedance spectroscopy (EIS) unit connected to the control unit, the EIS unit being configured to change a frequency of a current supplied to the battery cell into the plurality of selected frequencies according to a request of the control unit,
   wherein the control unit is further configured to calculate an impedance for the battery cell based on a plurality of voltages measured, while the plurality of currents whose frequencies are changed by the EIS unit are being supplied to the battery cell.

4. The battery management apparatus according to claim 3, wherein the voltage measuring unit is further configured to measure the voltage of the battery cell when a current having a frequency at which the voltage of the battery cell is not measured in advance among the plurality of frequencies is supplied to the battery cell, at the estimated SOC and the measured temperature.

5. The battery management apparatus according to claim 1, wherein:
   the estimated parameter value includes a value corresponding to the parameter of the predefined battery model; and
   the control unit is further configured to primarily update the battery model by changing a parameter corresponding to the obtained estimated parameter value among the parameters of the battery model into the obtained estimated parameter value.

6. The battery management apparatus according to claim 1, further comprising:
   a charging unit connected to the control unit, the charging unit being configured to supply a current to the battery cell and charge the battery cell at a preset C-RATE according to the estimated SOC and the measured temperature when the battery model is primarily updated by the control unit,
   wherein the control unit is further configured to secondarily update the battery model by updating the parameter of the battery model, based on a comparison result of the measured voltage value measured at the same point and the estimated voltage value obtained from the primarily updated battery model, when the battery cell is charged at the preset C-RATE by the charging unit.

7. The battery management apparatus according to claim 6, wherein the control unit is further configured to change a C-RATE of a charge current by controlling the charging unit, when the voltage difference is greater than or equal to the threshold value.

8. The battery management apparatus according to claim 7, wherein the control unit is further configured to:
  increase the C-RATE by controlling the charging unit when:
    the voltage difference is greater than or equal to the threshold value; and
    the estimated voltage value is greater than or equal to the measured voltage value; and
  decrease the C-RATE by controlling the charging unit when:
    the voltage difference is greater than or equal to the threshold value; and
    the estimated voltage value is less than the measured voltage value.

9. The battery management apparatus according to claim 7, wherein the control unit is further configured to update the parameter of the battery model until a voltage difference between the measured voltage value of the battery cell measured by the voltage measuring unit and the estimated voltage value obtained using the secondarily updated battery model at the same point becomes less than the threshold value, after the C-RATE is changed.

10. The battery management apparatus according to claim 1, wherein the control unit is further configured to, while the battery cell is being charged:
  estimate state information for a negative electrode of the battery cell using the secondarily updated battery model; and
  adjust a magnitude of a charge current applied to the battery cell so that the estimated state information does not reach a threshold condition.

11. The battery management apparatus according to claim 10, wherein the state information includes at least one of an estimated lithium ion ratio and a negative electrode potential for the negative electrode of the battery cell.

12. The battery management apparatus according to claim 11, wherein the control unit is further configured to adjust the magnitude of the charge current of the battery cell so that the estimated lithium ion ratio does not reach an upper threshold limit.

13. The battery management apparatus according to claim 11, wherein the control unit is further configured to adjust the magnitude of the charge current of the battery cell so that the negative electrode potential does not reach a lower threshold limit.

14. A battery pack, comprising the battery management apparatus according to claim 1.

15. A battery management method, comprising:
  a frequency selecting operation of selecting a plurality of frequencies corresponding to temperature and state of charge (SOC) of a battery cell;
  an impedance calculating operation of calculating an impedance of each frequency of the battery cell by applying a current having the plurality of frequencies selected in the frequency selecting operation to the battery cell;
  an estimated parameter value obtaining operation of obtaining an estimated parameter value of a predefined battery model by inputting the impedance of each frequency calculated in the impedance calculating operation to a pre-learned neural network;
  a battery model primary updating operation of primarily updating the battery model according to the estimated parameter value obtained in the estimated parameter value obtaining operation; and
  a battery model secondary updating operation of secondarily updating the battery model by repeatedly adjusting the parameter of the battery model until a voltage difference between the estimated voltage value, calculated through the primarily updated battery model in the battery model primary updating operation, and a measured voltage value for the battery cell becomes less than a threshold value.

* * * * *